US005257240A

United States Patent [19]

Lewis

[11] Patent Number: 5,257,240

[45] Date of Patent: Oct. 26, 1993

[54] WAVE RESTRUCTURER/NON-VOLATILE COMPUTER MEMORY BIT

[76] Inventor: Daniel J. Lewis, 250 Powderhouse Rd., Vestal, N.Y. 13850

[21] Appl. No.: 610,038

[22] Filed: Nov. 7, 1990

[51] Int. Cl.[5] .............................................. G11C 13/00

[52] U.S. Cl. ...................................... 365/244; 322/16

[58] Field of Search ............... 365/189.01, 244; 322/4, 322/16, 36

[56] References Cited

U.S. PATENT DOCUMENTS

| | | | |
|---|---|---|---|
| 897,507 | 9/1908 | Alexanderson | 322/16 |
| 2,704,431 | 3/1955 | Steele | 365/160 |
| 3,167,663 | 1/1965 | Melngailis | 365/160 |

*Primary Examiner*—Terrell W. Fears

[57] ABSTRACT

An input source is digitalized via a rotated wedge (or wedges) which is operatively sandwiched between a rigidly secured input wire (or wires) and a rigidly secured output wire (or wires).

4 Claims, 3 Drawing Sheets

WAVE RESTRUCTURER/NON-VOLATILE COMPUTER MEMORY BIT

BACKGROUND OF THE INVENTION

1.) Field of the Invention

The present invention relates to electrical source manipulation and distribution technology. Specifically, it provides for a versatile means by which to manipulate and simultaneously or otherwise distribute any inputs source or sources to the motor or motors used in electrical automobiles.

Another field of the invention is its ability to concretely and without speculation uncover the nature of electrical currents and voltages in a conductor under various conditions, i.e., the apparatus can be used for a scientific investigation into the nature of currents and voltages much in the same way as light waves have been studied, and so on.

2.) Description of the Prior Art

The prior art contains the distributor cap of an automobile. This invention is operatively connected to a gasoline engine. A source is imparted to said cap by a generator element. From the cap, this source is distributed to park plugs wherefrom, a spark is imparted to a confined aerated gasoline mixture. These conditions provide for the combustion of said mixture in the first step of the energy conversion process of the combustion engine.

The present invention is a much more versatile and capable source distributing means as the reader can more readily determine in the Brief Description below.

Unlike the above-identified cap, the present invention can simultaneously manipulate one or more input sources, and, it can simultaneously distribute said input sources to ne or more electrical motors. In this vain, the apparatus described herein is substantially different from the distributor in both function and environment.

A further desirable feature is that the present invention can be used in scientific investigations into the nature of alternating currents much in the same way as the nature of light, for example, has been studied as will become apparent in the Brief Description by way of example.

BRIEF DESCRIPTION OF THE INVENTION

One object of the invention then is to provide for a versatile source manipulation and distribution system for use in an electrical automobile in order to provide the motor or motors used in these cars with a pulsing digital or analog current and voltage.

Another object of the invention is to provide for a versatile source manipulation and distribution system used in a laboratory environment to study the nature of currents and voltages.

The wave restructurer, restructurer for short, is comprised of three disks, the current disk, the transconductive disk, and the frequency disk. Each disk can have one or more "point(s)" embedded around their circumferences. A point is a conductive element of a disk.

A point on the current disk will be referred to as an input wire. The current disk itself is a rigidly secured circular structure used as a means by which to rigidly attach and hold an input wire in place. The input wire is operatively connected to an operative input source such as an alternator. Together, the current disk and the input wire provide for a means by which any means for an input source can be introduced into the wave restructurer for restructuring.

A point on the frequency disk is referred to as an output wire. The frequency disk itself is a rigidly secured circular structure different from the current disk and used as a means by which to rigidly attach and hold an output wire in place. Most generally, though not necessarily as a rule, for each input wire of the current disk there is a corresponding output wire placed directly above it on the frequency disk. Together, the frequency disk and the output wire allow for a means by which to operatively connect a power drawing element to the output of the wave restructurer.

A point of the transconductive disk will be referred to as a wedge. The transconductive disk itself is a rigid and circular structure different from the current and frequency disks which allows for a means by which to rigidly attach a wedge. The transconductive disk is rigidly attached to the axle of a prime mover and, sandwiched in between the current and frequency disks. The transconductive disk is rotated by the prime mover. Together, the wedge, the rotation of its disk the transconductive disk and, its proximity to the input and output wires digitalize an input from any source.

Say for example that, only one wedge, one input wire and one output wire have been secured on their respective disks such that, when the transconductive disk is rotated, its wedge will make simultaneous contact with the input and output wires. When the wedge simultaneously passes the input and the output wires, it provides for a conductive path between these wires. Because the transconductive disk is being rotated, only a specific part of the input wave from an operative alternator, for example, is transferred from the input wire of the current disk, through the wedge of the transconductive disk, and, to the output wire of the frequency disk as a digital pulse.

In order to get a consistent and desirable output at the output wire of the frequency disk, the revolutions per second (rps) of the transconductive disks' prime mover is timed in accordance with the alternating output wave of the alternator.

Any ratio between the rps and Hertz can be used. For example, in using a 1 to 1 ratio, for each revolution of the transconductive disks' prime mover one cycle of the input sine wave from the alternator is completed.

The reader will please note that, the preceding and following conditions are arbitrary and not meant to limit the invention in any way.

Depending at which point of the sine wave the wedge provides for a conductive path between the input and the output wires, that part of the wave will be transferred to the output wire from the input wire via the wedge. The reader should be able to decide that any ratio between the source current and voltage can be consistently transferred to the output in the manner described above.

The source voltage and current can be separated by the restructurer. For example, say that the current lags the voltage by 90 degrees or analogously by a $\frac{1}{2}$ pi interval, and that, the ratio between the rps and Hertz is 1 to 1. The wedge can be made to consistently complete a conductive path between the input and output wires such that, at that time the peak positive current will be transferred to the output wire. However, since the current is lagging the voltage by 90 degrees, no source voltage will be present. Likewise, the source voltage can be separated from the source current. If a large voltage is being dealt with, for example, appropriate circuitry such as capacitance can be added in-line.

Some interesting questions can now be posed such as to indicate the idea behind the usefulness of my apparatus in the laboratory. For example, under load conditions, how will a source current behave once it has become separated from its driving source voltage? Can this current provide for its own voltage so to speak, and so on?

Another point can be made regarding the usefulness of my apparatus as a distributor in electrical automobiles. Until a conductive path has been completed by the wedge, the alternator (or generator) itself is not under load conditions. This means that the prime mover of the alternator does not have to work as hard since only a potential will be maintained in the coil of the alternator (or generator, and so on as the case may be). Therefore, the energy input to the prime mover is substantially less than when under load conditions. Under the influence of a digital current as described above, the electrical motor or motors of an electrical automobile will be pulsed by the alternator via the wave restructurer with no loss in function. This can be determined by the reader in the literature which concerns pulsing jet combustion engine technology.

From hereon, the reader can determine the applications of my apparatus in the above described technologies when my apparatus is of a more sophisticated nature as described below. Unless otherwise noted, in the following discussion it will be assumed that the ratio between the rps and Hertz is 1 to 1, that the peak positive current portion of the input wave is transferred to the output by a first wedge, and that, an alternator is used as the input source.

If now, to continue another wedge is operatively situated at a pi interval from the first wedge on the transconductive disk, and said disk being rotated, at the output wire of the frequency disk will be an analog current pulse, Note that, the second wedge can be set apart from the first at any interval.

Remove this wedge from the transconductive disk, and instead, operatively connect another input and output wire to their respective disks at a pi interval from the first. Operatively connect the input wires of the current disk together to form one input lead into the restructurer. Operatively connect this lead to the alternator.

When the transconductive disk is rotated the resultant will be digital current pulse in each output wire, however, in the first output wire will be a positive digital current and, in the second a negative digital current. These current pulses, in each respective output wire, will be at 180 degrees out of time with another, i.e., alternately stated, a pi interval of the input sine wave out of phase with the other. If the ratio of rps to Hertz is made to be 1 to 2 respectively then, both output wires will contain a positive digital current.

If now, the output wires on the frequency disk are also operatively connected together with the power drawing element, and, the ratio 1-1 then, the resultant would be an analog current pulse.

Replace the second wedge as was described above on the transconductive disk. Disconnect the output wires from one another and operatively connect each to separate power drawing elements. The resultant will be an analog current pulse in each output wire of the frequency disk.

Using only one wedge, disconnect the input wires of the current disk from each other, and, operatively connect them to separate alternators. (Note that, one wire could be connected to said alternator, but, the other one to any other means for a source).

If each sine wave from the alternators output waves are in peak phase with one another and the transconductive disk rotated, the resultant will be a digital current pulse in each respective output wire of the frequency disk. One output wire will consistently contain a positive digital current and, the other a negative digital current. If a wedge is added as above, and the output wires combined and operatively connected to a single power drawing element, the resultant would be an increase in current density. The wave restructurer can increase or otherwise manipulate current and voltage amplitudes. Note that, voltage manipulation as described above is analogous to current manipulation.

Disconnect the output wires of the frequency disk from one another and connect each to separate power drawing elements. If only one wedge is used on the transconductive disk, and, the alternators are made to be 180 degrees out of peak phase with one another then, the resultant would be positive digital current pulses in each output wire of the frequency disk. If the output wires are operatively connected together, the resultant at the output is a positive digital current pulse which, pulses at twice the Hertz of either single alternator. The wave restructurer can increase the frequency of the output.

If the second wedge is replaced as above and, the output wires disconnected, the resultant analog current pulse in each output wire would be simultaneously 180 degrees out of phase. If the output wires of the frequency disk are operatively connected, the resultant would be a net cancellation of current. Cancellation is one means by which to manipulate any input source.

Assume that, the voltage lags the current by 90 degrees. If the alternators are made to be 90 degrees out of peak phase with one another, the output wires operatively connected together, and, the second wedge and, input and output wires operatively connected to their respective disks at a one half pi interval from the first then, the voltage from one alternator will drive the current from the other.

As was noted above, the restructurer can increase the frequency of the input to a power drawing element. In the specific example given this frequency was increased by a factor of two. If only one alternator was used to gain this double frequency input, it would have to be rotated at twice a velocity in which case, its prime mover would have to be four times as large since, an alternator being rotated at twice some comparative velocity will give four times a comparative power output. However, the combined mechanical power input of the prime movers used to rotate each of the alternators as described above is ½ that as would be needed to rotate either of time at twice a velocity.

Finally note that, the wedge of the transconductive disk itself, can be made of a magnetic material, i.e., a material which displays magnetic properties. The description of the user of a magnetic wedge is more suited to the Preferred Embodiments where, diagrams can assist the reader in an understanding. Also, any number of wedges, input wires and output wires can be used to gain some desired output as was described above.

DESCRIPTION OF THE PREFERRED EMBODIMENTS

Figure 1:
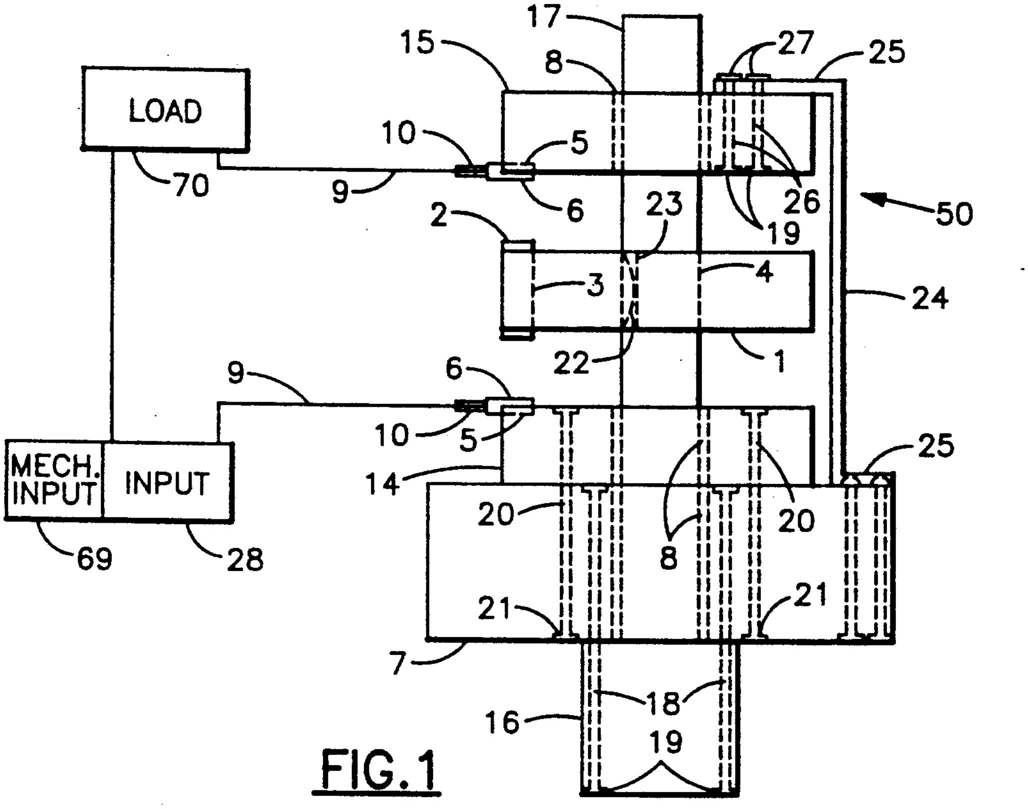
FIG. 1) Shown is the overall structure of the invention with only one input and output wire, and one wedge on each respective disk.

To make an illustrative model of the invention you will need a motor, (an engine being analogous), say a 120 V 0.5 amp. variable speed motor, with a keyed axle which is one half inch in diameter and 3.5 inches long; two alternators of any size (other generator elements and sources being analogous); three non-conductive plastic disks which are one half inches thick with a four inch diameter; two 0.51 inches wide, one inch long and 0.1 inches thick pieces of steel (other means for a conductor such as a magnetic material being analogous); four 2 inch long 12 gauge pieces of wire; six feet of multiply stranded 12 gauge wire; eight appropriate electrical connector caps; some epoxy resin; a half inch wide, 5.75 inch long, 0.125 inches thick bar; six two inch long, 0.125 inches diameter nuts and bolts; two quarter inch diameter, three inch long nuts and bolts; and, a board which is two inches thick and a foot square.

Take all three of the disks and mark them at a point around their circumferences. On one of the disks, see FIG. 1, at these points, cut a 0.09 inches wide vertical slice (3) which runs from the disk's top surface to it's bottom surface, and, which extends one inch into the disk from it's circumference edge along the radial lines, i.e., in toward it's center point. Fill one of the slices (3) with epoxy and, press fit a steel wedge (2) into it such that, the wedge extends beyond the top and bottom surfaces of the disk 0.005 inches.

Drill a half inch hole (4) into and through this disk's center, and, cut a key groove (23) in the hole (4) which will fit snugly over the motor's key (22). This disk will be referred to as the transconductive disk (1).

At one of the "points" scribed on each of the other disks, cut a groove (5) along their top surface radial lines such that, a 12 gauge wire (6) will fit snugly into them, and such that the 12 gauge wire's length will stick 0.005 inches above their top surfaces and, extend one inch beyond these disk's circumference. Place some epoxy into each groove (5) and, place wires (6) into them as described. In the center of these disks and, the board (7), drill a three quarter inch diameter hole (8).

Cut the six foot length of wire into two equal sections (9), stripping both ends. Using the caps (10), tie one length (9) to each of the 12 gauge wires (6). One of these disks will be referred to as the current disk, the other, as the frequency disk.

Now secure the motor (16) to the board by placing it's axle (17) up through the hole (8). Drill 2 quarter inch diameter holes (18) down through the board (7) such that, the motor (16) can be attached to it. Counterbore theses holes in the top surface of the board such that, each of the two 3 inch long bolt heads will be an eighth inch below the surface. Stick the bolts (19) down through the board (7) and use them to secure the motor (16) to it.

Center the current (14) disk's center hole (8) over the axle (17) with the 12 gauge wire (6) facing up and, drill two 0.125 inch diameter holes (20) through the disk (14) and the board (7). Counterbore these holes in the disk and the board such that, the 2 inches long bolt's (21) heads will be recessed below the disk's top surface, and similarly, the nuts on the board's bottom surface. Bolt the disk (14) to the board (7).

Operatively connect the transconductive disk (1) to the axle (17) using the axle's key (22) and the transconductive disk's key groove (23) such that, the wedge (2) of the transconductive disk and wire (6) of the current disk can make contact with one another when the transconductive disk is rotated.

Get the bar (50), and bend it such that, it resembles a "z", with the middle portion of the "z" such that it is perpendicular to the board's (7) top surface, and such that, the top and bottom parts of the "z" are parallel to the board's surface. Make the perpendicular part of the "z" 0.75 inches in height (24), and, the parallel parts of the "z" 2.5 inches each in length (25).

Lay the frequency disk (15) such that the conductive wire (6) faces up. Drill two 0.125 inch diameter holes (26) through the disk and counterbore them such that, the bolt's (19) heads will be recessed below the disk's output wire surface. Drill two similarly spaced holes (27) in the top part of the "z", and, suspend the frequency disk underneath it, with the conductive wire hanging down. Stick the bolts up through the disk, and secure it to the bar using nuts.

Center the frequency disk's hole (8) on the axle (17) and operatively connect the bottom half of the "z" to the board (7) (using the last of the nuts and bolts) such that, the disk's wire (6) can make contact with the transconductive disk's wedge (2) when the transconductive disk is rotated. Also, operatively align the input and output wires of the frequency and current disks atop one another so that, when the transconductive disk is rotated, it's wedge can provide for an operative conduction path between between the input and output wires.

Operatively connect the alternator to it's operative prime mover means (69). To complete a circuit with the restructurer, operatively connect alternator (28) to the input wire (9) of the current disk, operatively connect the output wire (9) of the frequency disk to the input of the power drawing element (70), and, operatively connect the return lines of (70 and 28). Appropriate circuitry can be added anyplace in-line.

To operate the restructurer, connect the motor (16) to a source, and, turn it and prime mover (69) on. This causes the transconductive disk (1) and alternator (28) to rotate. When the transconductive disk is rotated, as the wedge (2) simultaneously passes the operatively situated wires (6), a specific part of the alternator's wave input will be transferred from the input of the current disk to the output of the frequency disk as a digital current pulse.

Figure 2:
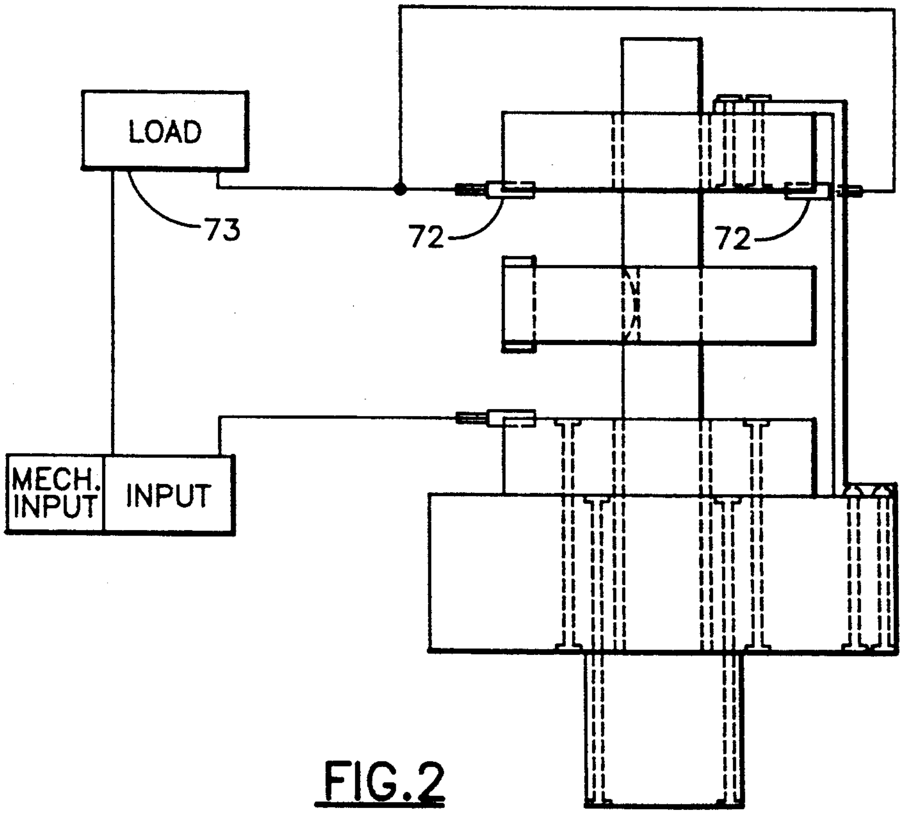
FIG. 2) Shown is the invention of FIG. 1 with more than one output wires being operatively connected on the frequency disk.

FIG. 2 shows the restructurer of FIG. 1 above with more than one output wires (72) being operatively connected to the frequency disk at a pi interval from the first as described above. These output wires are shown operatively connected together to form one output to power drawing element (73).

Note that, the second output wire is inoperative unless, the wedge is made of a material which displays magnetic and conductive properties. In which case, the magnetic wedge will induce a current in the second output wire which, will be used as input to the power drawing element.

Figure 3:
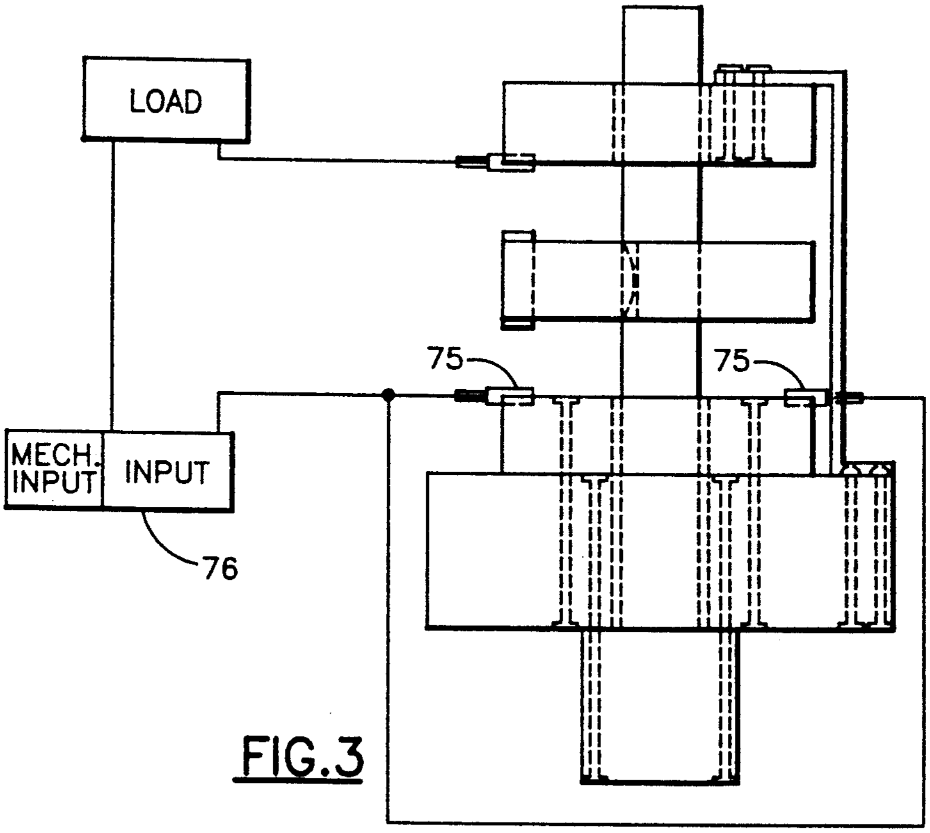
FIG. 3) Shown is the invention of FIG. 1 with more than one input wires being operatively connected to the current disk.

FIG. 3 shows the restructurer of FIG. 1 above with more than one input wires (75) being operatively connected to the current disk at a pi interval from the first as described above. These input wires are shown operatively connected together to form one input to the restructurer from the alternator (76).

As above in FIG. 2, the second input wire is inoperative unless, two wedges are used, at least one of which is made of a material which displays magnetic properties. In this case, the current induced in the second input wire would act as a source. Depending upon the nature of this source, it will either augment or diminish the current from the alternator being distributed through the first input wire to the power drawing element. Note that, the second wedge does not necessarily have to have conductive properties.

Figure 4:
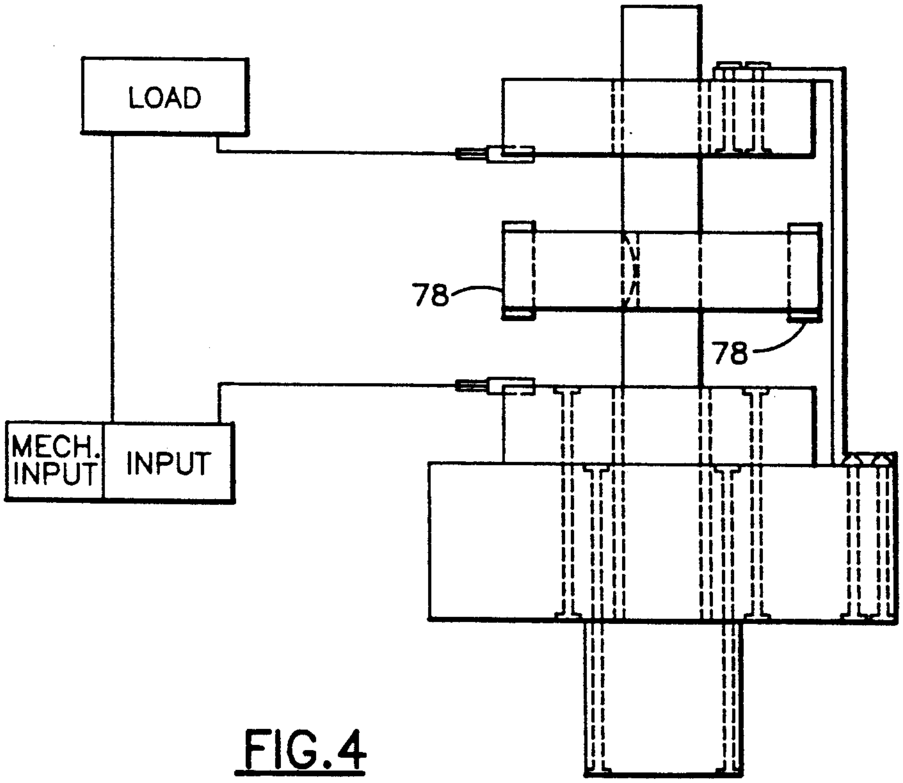
FIG. 4) Shown is the invention of FIG. 1 with more than one wedge being operatively connected to the transconductive disk.

FIG. 4 shows the restructurer of FIG. 1 above with more than one wedges (78) being operatively connected to the transconductive disk at a pi interval from the first as described above.

Figure 5:
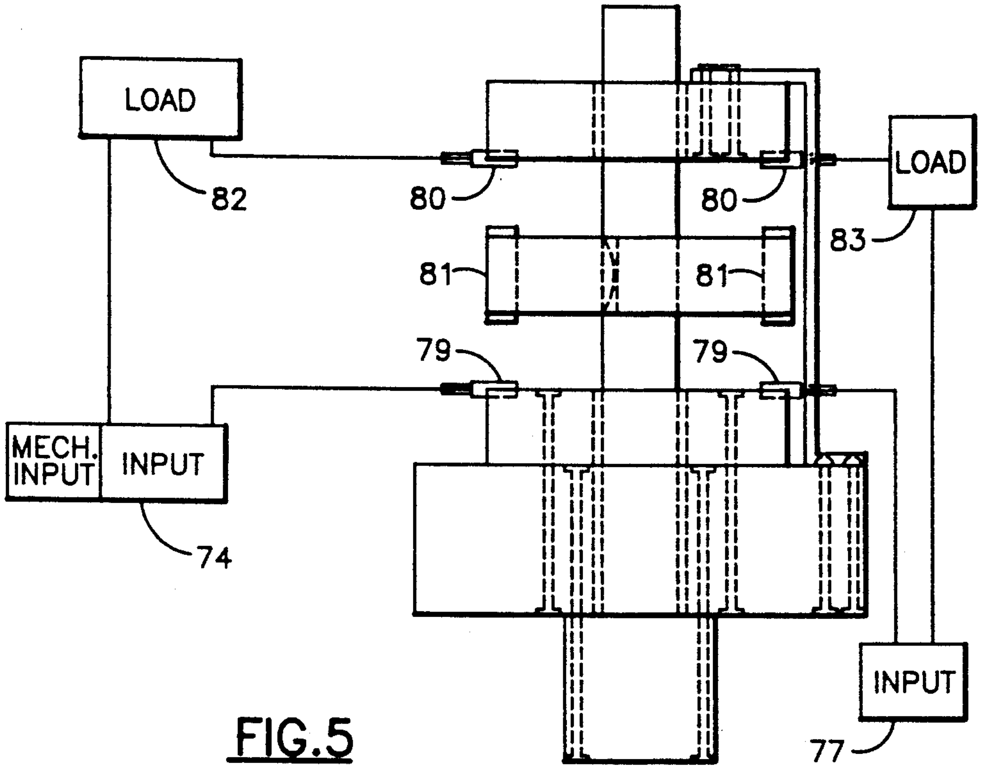
FIG. 5) Shown is a combination of the invention shown in FIGS. 2, 3 and 4 operatively accommodating two operative power generating source inputs, and two power drawing elements simultaneously.

FIG. 5 shows the combinations of input (79) and output (80) wires and wedges (81) shown in FIGS. 2, 3, and, 4 above being assembled in one restructurer. This figure shows the input and output wires, operatively connected to input sources (74 and 77), and power drawing elements (82 and 83), respectively.

Figure 6:
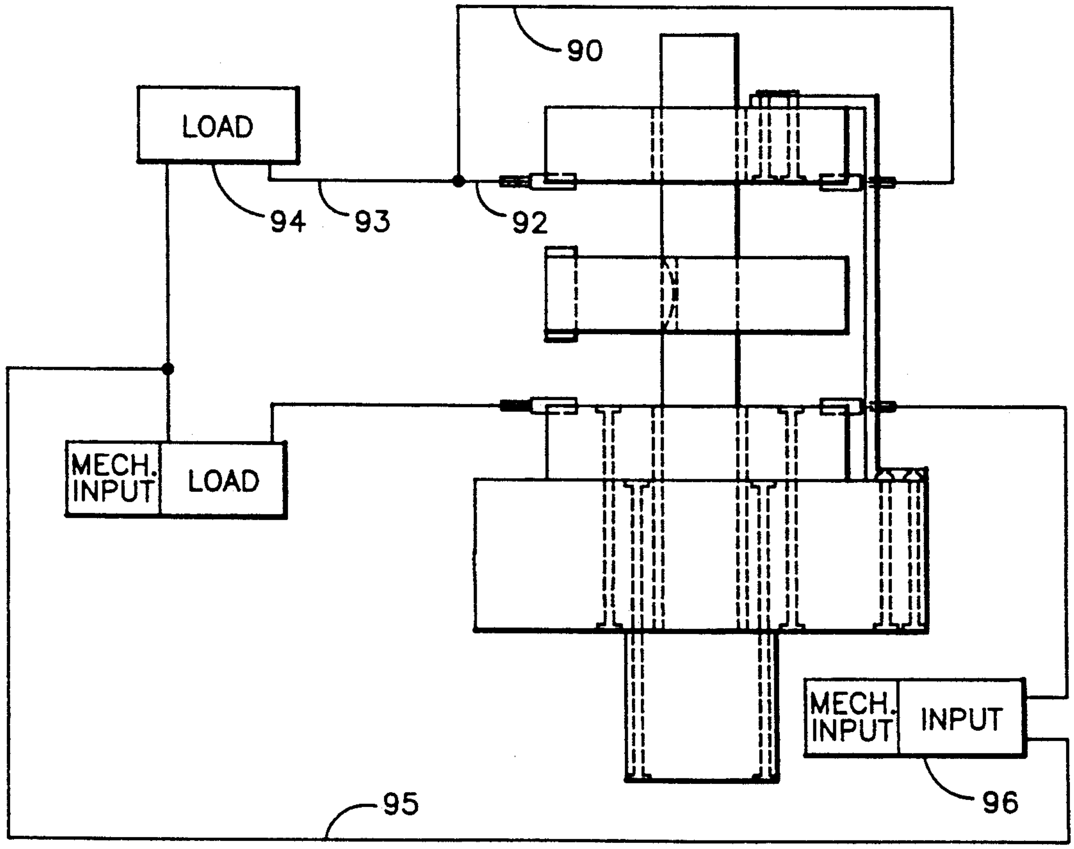
FIG. 6) Shown is the apparatus of FIG. 5 minus a wedge and a power drawing element.

FIG. 6 shows the apparatus shown in FIG. 5 with one wedge and one power drawing element removed. The output wires (90 and 92) are then operatively connected together to form one output wire (93) which is operatively connected to power drawing element (94). The return line (95) and (94) is operatively connected to operative input source (96).

I claim:

1. In combination with a power source and a power drawing element:

a) an input wire means operatively attached to a means for a current disk and operatively connected with said power source;

b) an output wire means operatively attached to a means for a frequency disk and operatively connected with said power drawing element;

c) a wedge means operatively attached to a means for a transconductive disk;

d) a means for mechanical power input operatively connected to said transconductive disk;

e) said wedge, said mechanical power input rotates said transconductive disk, said wedge makes simultaneous and momentary electrical contact with both said input wire and said output wire once during a complete revolution of said transconductive disk; and f) an operative circuit between said power source and said power drawing element where said circuit is complete when said wedge makes said electrical contact with said input wire and said output wire thus providing said power drawing element with a single pulse of digital current once during said complete revolution.

2. The apparatus of claim 1 comprising:

a) said input wire where, said input wire is a plurality of wires;

b) and, said output wire where, said output wire is a plurality of wires.

3. The apparatus of claim 1 comprising:

a) said wedge where, said wedge is a plurality of wedges.

4. The apparatus of claim 2 comprising:

a) said wedge where, said wedge is a plurality of wedges.

* * * * *